United States Patent [19]
Currin et al.

[11] Patent Number: 5,999,008
[45] Date of Patent: Dec. 7, 1999

[54] INTEGRATED CIRCUIT TESTER WITH COMPENSATION FOR LEAKAGE CURRENT

[75] Inventors: Jeffrey D. Currin, Pleasanton; Henry Y. Pun, Santa Clara, both of Calif.

[73] Assignee: Credence Systems Corporation, Fremont, Calif.

[21] Appl. No.: 08/846,776

[22] Filed: Apr. 30, 1997

[51] Int. Cl.⁶ .................................................. G01R 31/26
[52] U.S. Cl. ........................................ 324/765; 324/763
[58] Field of Search .................................. 324/130, 765, 324/763, 158.1; 330/9, 362

[56] References Cited

U.S. PATENT DOCUMENTS

| | | | |
|---|---|---|---|
| 3,070,786 | 12/1962 | MacIntyre | 341/118 |
| 3,978,399 | 8/1976 | Chadbourne | 324/225 |
| 4,229,703 | 10/1980 | Bustin | 327/307 |
| 4,763,028 | 8/1988 | Henry | 327/378 |
| 5,493,246 | 2/1996 | Anderson | 327/382 |
| 5,563,587 | 10/1996 | Harjani | 340/870.3 |

*Primary Examiner*—Josie Ballato
*Assistant Examiner*—Russell M. Kobert
*Attorney, Agent, or Firm*—Smith-Hill and Bedell

[57] ABSTRACT

In an integrated circuit tester module, pin electronics circuitry supplies leakage current to a circuit node which is connected to a signal pin of a device under test. The leakage current is compensated by connecting the circuit node to a voltage source at a first potential level, supplying current to the circuit node from a second potential level, and measuring current supplied to the circuit node from the voltage source. The second potential level is selectively varied in a manner such as to reduce the current supplied from the voltage source substantially to zero. The circuit node is then disconnected from the voltage source.

6 Claims, 2 Drawing Sheets

INTEGRATED CIRCUIT TESTER WITH COMPENSATION FOR LEAKAGE CURRENT

BACKGROUND OF THE INVENTION

This invention relates to an integrated circuit tester with compensation for leakage current.

An integrated circuit tester is used to predict how an integrated circuit device will behave in operation. A typical integrated circuit tester includes a test head having multiple tester modules, each of which has a signal terminal. Each tester module includes pin electronics which operates the module selectively in one of several operating modes, which typically include drive high, drive low, compare high and compare low. In the drive high mode, for example, the pin electronics applies a logic high signal to the signal terminal, whereas in the compare low mode, the pin electronics compares the voltage at the signal terminal with a low threshold value. In order to carry out a test, the test head is positioned with the signal terminals of the tester modules in contact with respective pads of a load board. The load board provides a parallel electrical interface between the signal terminals of the tester modules and signal pins of the device under test (DUT). The load board may support connections to multiple devices in order to allow multiple devices to be tested concurrently.

The tester includes a device power supply (DPS) having force and return terminals connected through the load board to the positive and negative power supply pins respectively of the DUT to supply operating current to the DUT. A test is executed in a succession of cycles, and for each cycle of the test, each tester module is placed in a selected one of its predetermined operating modes. In this manner, the DUT is exercised through a sequence of internal states, and the nature of the output of the DUT in each state is observed. In the case of a complex DUT, there may be many thousands of test cycles and therefore the testing can take a long time.

Two aspects of testing of an integrated circuit device are functional testing and quiescent current testing. The purpose of functional testing is to determine whether the DUT provides the expected output in each state. The purpose of quiescent current testing is to detect anomalies in current consumption by measuring the current drawn by the DUT in steady state, when there are no changes in state occurring. In a high speed functional test, the DPS may supply several amps of current, whereas a much smaller current is drawn during quiescent current testing.

FIG. 3 illustrates part of an integrated circuit tester used for testing an integrated circuit device. As shown in FIG. 3, a typical gate in a MOS integrated circuit device comprises a pull-up FET Q1 and a pull-down FET Q2 having their drain/source current paths connected in series between a $V_{DD}$ rail and a $V_{SS}$ rail, which are connected to the power supply pins of the device. The output of the gate is taken from the node to which the drain of the pull-down FET Q2 and the source of the pull-up FET Q1 are connected, and may be connected to the gate of another FET Q3 in order to affect the state of that transistor. In one state of the gate Q1, Q2, the pull-up transistor Q1 is on and the pull-down transistor Q2 is off, and the output of the gate is accordingly at a voltage very close to $V_{DD}$, whereas in another state of the gate, the pull-up transistor Q1 is off and the pull-down transistor Q2 is on and the output is at a voltage very close to $V_{SS}$. If the output of the gate is connected to a pin 2 of the DUT, the state of the gate Q1, Q2 can be tested by comparing the voltage at the pin 2 with a high or low threshold voltage.

The tester includes a current measuring device power supply (DPS) 4 having force and return lines connected to power supply pins of the device under test (DUT) 6 to supply operating current to the DUT, and multiple tester modules 10, only one of which is shown, each having a terminal connected to a signal pin 2 of the DUT. Generally, the return line of the DPS is tied to ground.

It may be desired not only to exercise the DUT through a sequence of states in order to test it, but it may also be necessary to measure quiescent current $I_{DDQ}$ drawn by the DUT in selected states in order to detect anomalies in current consumption. The quiescent current is measured by measuring the voltage drop across a current sensing resistor when the DUT is in a target state.

Ideally, the tester module 10 presents an infinite impedance to the signal pin. Therefore, if the transistor Q1 is on and the transistor Q2 is off, no leakage current flows through the pin electronics. However, in practice the pin electronics does not have an infinite impedance and so there is a leakage current path from the force terminal of the DPS to the return terminal through the tester module, as indicated by the arrow in FIG. 3. The leakage current $I_{lkge}$ introduces an error term into the measurement of $I_{DDQ}$.

It has been proposed that an electromechanical relay switch 14 should be connected between the signal terminal of the tester module and the pin electronics and that the switch should be opened (rendered non-conductive) when carrying out a quiescent current measurement in order to prevent flow of leakage current through the pin electronics. However, this is not an optimum solution because of the finite time taken to open the relay switch prior to the measurement and to close the relay switch after the measurement, to resume functional testing of the DUT. Although this time is fairly short, it might be desirable to make several thousand measurements of quiescent current on any particular device, and the total time taken to open and close the relay switch then adds significantly to the time taken for testing the device.

SUMMARY OF THE INVENTION

According to a first aspect of the present invention there is provided an improved tester module for an integrated circuit tester, said tester module having a signal terminal for connecting to a signal pin of a device under test, said tester module comprising pin electronics connected to a circuit node of the tester module and a current measurement circuit connected to said circuit node and providing an output signal representative of leakage current supplied by the pin electronics, and wherein the improvement resides in a controllable current source connected to said circuit node and responsive to a control signal to supply current to the pin electronics.

According to a second aspect of the present invention there is provided an integrated circuit tester comprising a tester module having a signal terminal for connecting to a signal pin of a device under test, said tester module including pin electronics connected to a circuit node, a current measurement circuit connectable to said circuit node and providing an output signal representative of leakage current supplied by the pin electronics when it is so connected, and a controllable current source connected to said circuit node and responsive to a control signal to supply current to the pin electronics, and a control means connected to receive the output signal provided by the current measurement circuit and generate the control signal supplied to the current source.

BRIEF DESCRIPTION OF THE DRAWINGS

For a better understanding of the invention, and to show how the same may be carried into effect, reference will now be made, by way of example, to the accompanying drawings, in which.

In the several figures, like reference numerals designate corresponding elements.

DETAILED DESCRIPTION

Figure 1:
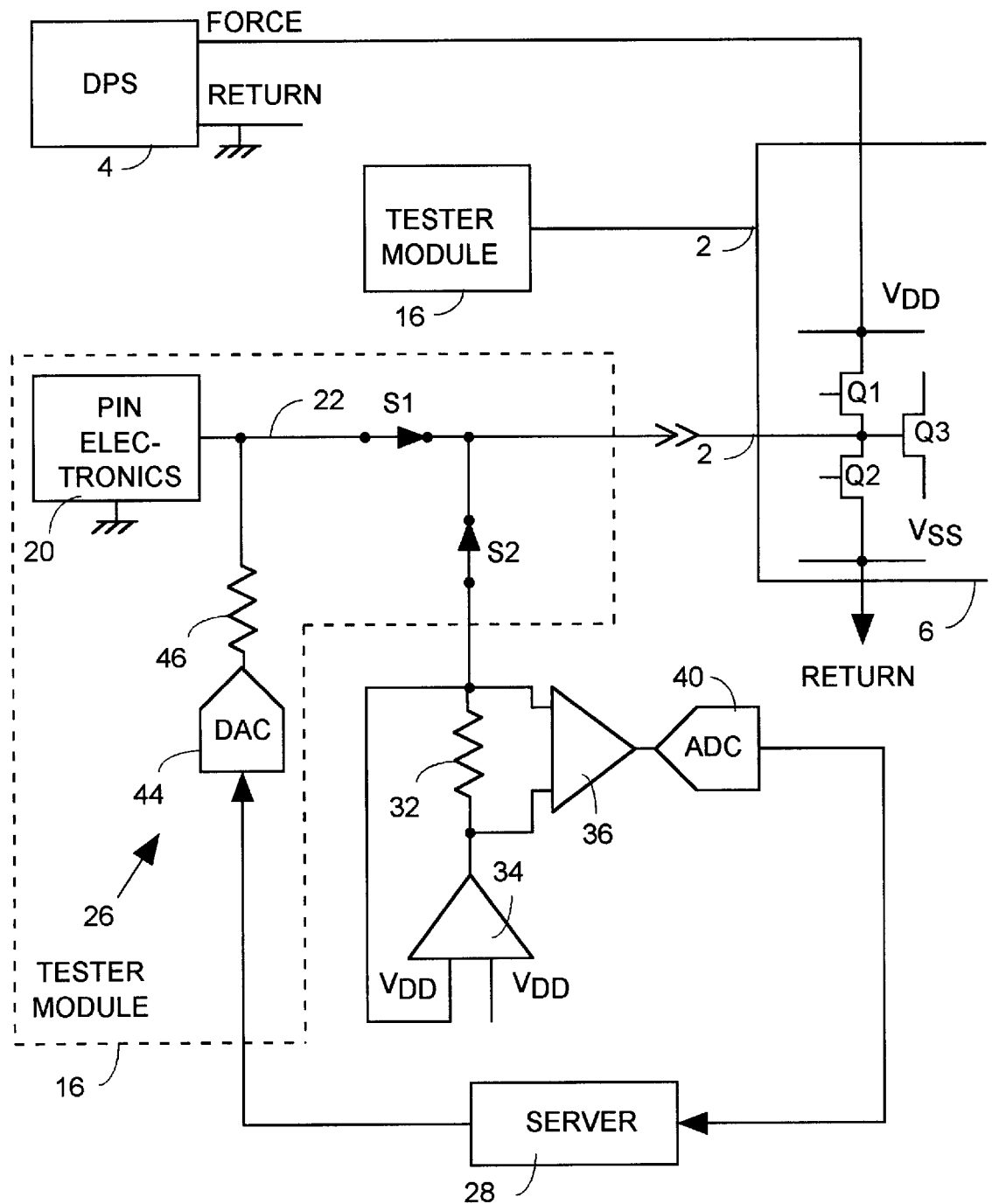
FIG. 1 is a partial schematic block diagram of an integrated circuit tester in accordance with the present invention in a first configuration.

Each tester module 16 of the tester shown in FIG. 1 includes pin electronics 20 having a terminal connected to a circuit node 22. During a test of the DUT 6, the node 22 is connected through a normally closed (conductive) switch S1 to the signal pin 2 of the DUT for selectively forcing the pin 2 to a high or low voltage or comparing the voltage at the pin with a high or low threshold voltage. The node 22 is also connected to a controllable current source 26. The node can be connected through the switch S1, a normally open (non-conductive) switch S2 and a current sensing resistor 32 to a differential amplifier 34. The tester shown in FIG. 1 operates under control of a server 28.

A second differential amplifier 36 provides an output signal dependent on the current flowing through the resistor 32 and an analog-to-digital converter (ADC) 40 converts the analog output signal of the amplifier 36 to digital form. The digital output signal of the ADC 40 is supplied to the server 28.

The controllable current source 26 comprises a digital-to-analog converter (DAC) 44 and a resistor 46. The DAC 44 generates an output voltage which depends on a digital control signal received from the server 28. Accordingly, the current source 26 supplies current to the node 22 at a level which depends on the digital control signal supplied to the DAC 44 by the server 28.

During a calibration phase, the tester module is not connected to the pin 2 of the DUT, so that the pin electronics 20 is isolated from the DUT 6, and the switches S1 and S2 are closed. The voltage $V_{DD}$ for the specific DUT 6 is applied to one input of the differential amplifier 34 and the differential amplifier 34 supplies sufficient current to the node 22 through the resistor 32 and the switches S1 and S2 to force the node 22 to the voltage $V_{DD}$, i.e. the voltage that would be present at the node 22 during measurement of $I_{DDQ}$ with the FET Q1 on and the FET Q2 off. Consequently, the total current supplied to the node 22 is equal to $I_{lkge}$. The current supplied by the differential amplifier 34 is measured by the differential amplifier 36 and ADC 40, which provide the server 28 with a digital signal representative of the current supplied by the amplifier 34. The server adjusts the output voltage of the DAC 44 until no current flows through the current sensing resistor 32. At this point, the current supplied by the DAC 44 is equal to $I_{lkge}$. The current supplied to the node 22 holds the node at $V_{DD}$.

Figure 3:
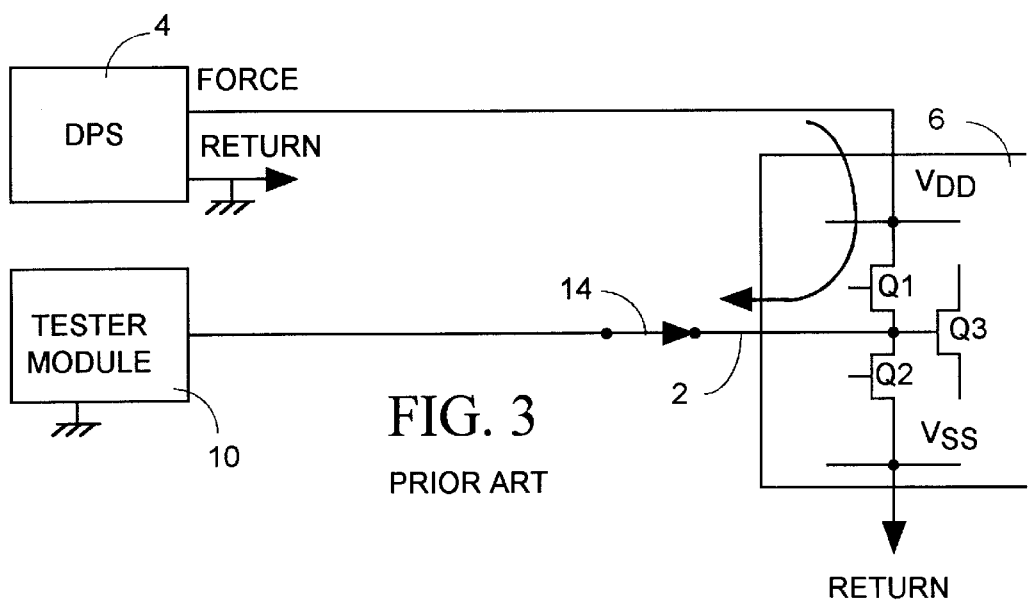
FIG. 3 is a partial schematic block diagram of a tester in accordance with the prior art.

During the measurement phase, the tester module is connected to the pin 2. The switch S1 remains closed and the switch S2 is open. Since the node 22 is at $V_{DD}$, no current flows from the pin 2 into the pin electronics and consequently the accuracy of a measurement of $I_{DDQ}$ is not impaired by the leakage current. Therefore, it is possible to measure $I_{DDQ}$ when the transistor Q1 is on and the transistor Q2 is off without its being necessary to isolate the pin electronics from the pin of the DUT and accurate measurements of $I_{DDQ}$ can be made more rapidly than when using the technique described with reference to FIG. 3.

It will be understood by those skilled in the art that the value of $V_{DD}$ depends on the particular device that is to be tested, and accordingly the calibration phase may involve determining the proper output voltages of the DAC 44 for several different values of $V_{DD}$, such that the proper voltage can be invoked when carrying out a test.

Figure 2:
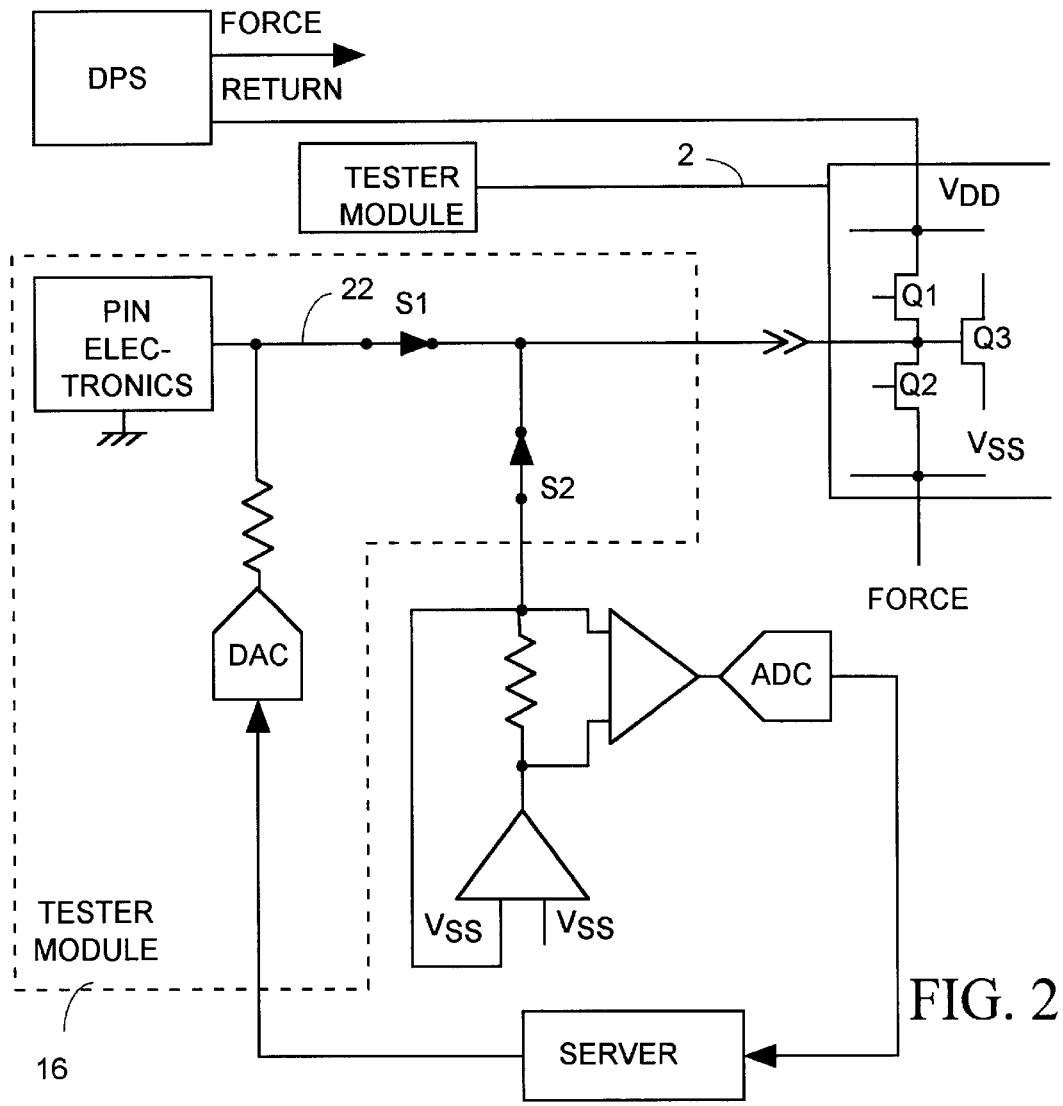
FIG. 2 is a similar view of the tester in a second configuration.

In the event that the DPS forces a negative voltage, so that. the force terminal of the DPS is connected to the $V_{SS}$ rail and the return line is connected to the $V_{DD}$ rail, as shown in FIG. 2, leakage current can impair the accuracy of a measurement of $I_{SSQ}$ when the transistor Q1 is off and the transistor Q2 is on. In this case also, the tester module can be calibrated in a similar manner to generate a digital signal which can be applied to the DAC 44 to generate a current that will compensate for the leakage current. It will be appreciated that in the case of FIG. 2, the direction of the leakage current might be opposite to that in the case of FIG. 1.

It will be appreciated that the invention is not restricted to the particular embodiment that has been described, and that variations may be made therein without departing from the scope of the invention as defined in the appended claims and equivalents thereof. For example, the invention is not restricted to the controller for adjusting the digital signal applied to the DAC 44 in response to the digital signal provided to the ADC 40 being included in the server, since this function could be provided by a controller included in the tester module. Further, in the described embodiment of the invention, the DAC 44 serves as a controllable voltage source, but the invention is not restricted to use of a DAC in the tester module as the controllable voltage source since several techniques are used in integrated circuit testers for providing controllable reference voltage levels. For example, the controllable voltage source could be implemented using a DAC which is in the shared resources of the tester and a sample-and-hold which is in the per-pin resources and samples the output of the DAC when the DAC receives the digital control word that is required to provide the proper voltage output. In an embodiment of the invention the current sensing resistor 32 and the differential amplifier 36 are shared among all the tester modules, but they could alternatively be shared among a group of fewer than all the tester modules or be part of the per-pin resources.

We claim:

1. An improved tester module for an integrated circuit tester, said tester module having a signal terminal for connecting to a signal pin of a device under test, said tester module comprising pin electronics connected to a circuit node of the tester module for supplying a test signal to, or receiving a test signal from, the circuit node, the pin electronics having a finite impedance, whereby the pin electronics supplies current to the circuit node when the node is held at a predetermined voltage level, and wherein the tester further comprises a current measurement circuit connected to said circuit node and providing an output signal representative of current supplied to the circuit node by the pin electronics, and wherein the improvement resides in a controllable current source connected to said circuit node and responsive to a control signal to supply an opposite and substantially equal current to the circuit node, whereby current supplied by the pin electronics is at least partially balanced by current supplied by the controllable current source.

2. A tester module according to claim 1, including a switch connected between said circuit node and the signal terminal of the tester module.

3. An integrated circuit tester comprising:

a tester module having a signal terminal for connecting to a signal pin of a device under test, said tester module including pin electronics connected to a circuit node of the tester module for supplying a test signal to, or receiving a test signal from, the circuit node, the pin electronics having a finite impedance, whereby the pin electronics supplies current to the circuit node when the node is held at a predetermined voltage level, a current measurement circuit connectable to said circuit node and providing an output signal representative of current supplied to the circuit node by the pin electronics, and a controllable current source connected to said circuit node and responsive to a control signal to supply current to the pin electronics, and a control means connected to receive the output signal provided by the current measurement circuit and generate the control signal supplied to the current source.

4. A tester according to claim 3, further comprising a device power supply for forcing a voltage of a selected polarity relative to a ground reference level, and wherein the current measurement circuit is operable to receive current at a level such that the circuit node is maintained at a potential level substantially equal to the force voltage supplied by the device power supply, and the control means is operable in a first mode to cause the current source to supply zero current to the circuit node, whereby the output signal provided by the current measurement circuit is representative of the current supplied by the pin electronics, and is operable in a second mode to adjust the control signal to cause the current source to supply current to the circuit node at a level such that the current received by the current measurement circuit is reduced substantially to zero.

5. A tester according to claim 4, wherein the force voltage is positive relative to the ground reference level.

6. A tester according to claim 4, wherein the force voltage is negative relative to the ground reference level.

* * * * *